(12) United States Patent
Hsu et al.

(10) Patent No.: US 12,255,150 B2
(45) Date of Patent: Mar. 18, 2025

(54) CMP SAFE ALIGNMENT MARK

(71) Applicant: Taiwan Semiconductor Manufacturing Co., Ltd., Hsinchu (TW)

(72) Inventors: Huang-Jen Hsu, Hsinchu (TW); Jheng-Si Su, Hsinchu (TW); Kung-Ming Liu, Hsinchu (TW); Tzuyi Hsieh, Hsinchu (TW); Feng-Inn Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 492 days.

(21) Appl. No.: 17/369,841

(22) Filed: Jul. 7, 2021

(65) Prior Publication Data
US 2022/0102285 A1    Mar. 31, 2022

Related U.S. Application Data

(60) Provisional application No. 63/085,548, filed on Sep. 30, 2020.

(51) Int. Cl.
*H01L 23/544* (2006.01)
*H01L 21/02* (2006.01)
*H01L 21/3105* (2006.01)
*H01L 29/06* (2006.01)

(52) U.S. Cl.
CPC ...... *H01L 23/544* (2013.01); *H01L 21/02118* (2013.01); *H01L 21/02164* (2013.01); *H01L 21/0217* (2013.01); *H01L 21/31053* (2013.01); *H01L 29/0649* (2013.01); *H01L 2223/54426* (2013.01)

(58) Field of Classification Search
CPC ............. H01L 23/544; H01L 21/02118; H01L 21/02164; H01L 21/0217; H01L 21/31053; H01L 29/0649; H01L 2223/54426
See application file for complete search history.

(56) References Cited

U.S. PATENT DOCUMENTS

| | | | |
|---|---|---|---|
| 2016/0133746 A1* | 5/2016 | Su | H01L 21/823821 438/283 |
| 2017/0018453 A1* | 1/2017 | Park | H10B 12/0335 |
| 2020/0103763 A1 | 4/2020 | Wen et al. | |

FOREIGN PATENT DOCUMENTS

| | | |
|---|---|---|
| TW | 201903898 A | 1/2019 |
| TW | 202017119 A | 5/2020 |

* cited by examiner

*Primary Examiner* — Monica D Harrison
*Assistant Examiner* — Andre C Stevenson
(74) *Attorney, Agent, or Firm* — Seed IP Law Group LLP

(57) ABSTRACT

The current disclosure describes techniques for making an alignment mark on a wafer. A recess is etched in a first surface region of a wafer. A device structure is formed in a second surface region of the wafer. A dielectric layer is deposited on the first surface of the wafer and filling the recess. A first planarization procedure is conducted to planarize the dielectric layer. After the first planarization procedure, a second planarization procedure is conducted to device structures on the second surface region of the wafer.

13 Claims, 6 Drawing Sheets

CMP SAFE ALIGNMENT MARK

BACKGROUND

Semiconductor integrated circuit (IC) technology has experienced rapid progress including the continued minimization of feature sizes and the maximization of packing density. The minimization of feature size relies on improvement in photolithography and its ability to print smaller features or critical dimensions (CD). This is further related to wafer alignment. The wafer alignment is conducted in the lithography scanner. The scanner will expose the wafer based on the alignment result. To reduce the overlay errors, it is needed to improve the alignment accuracy and the overlay measurement accuracy result.

Alignment marks and the process of aligning alignment marks are key aspects of fabricating wafers and integrated circuit (IC) chips in the manufacture of semiconductor components. They are key because the chips themselves, and the devices that go into making the chip components, are fabricated by aligning many intricate layers of conductors and insulators, one upon the other, on a substrate, usually silicon. And, in the resulting structure, called the wafer, it is critical that each layer is precisely aligned with the previous layer so that the circuits formed therein are functional and reliable.

Typically, the alignment of one layer with respect to another is accomplished by means of a tool known as a wafer Stepper. The wafer Stepper is used to project optically a circuit pattern from a reticle mounted in the wafer stepper onto a layer formed on the semiconductor wafer. However, before the pattern on the reticle is transferred, the wafer must first be positioned or aligned precisely with respect to the reticle. Thus, a wafer ready to be patterned is loaded onto a wafer stepper. Then, using the alignment marks already on the wafer, the wafer is aligned in relation to the reticle. Once the alignment is accomplished, the remaining steps of projecting the pattern on to the semiconductor may proceed.

In photolithography alignment, alignment marks are used to align a wafer with a mask plate. For example, an off-axis alignment system is used to gauge alignment marks on a target wafer and reference marks on a reference plate located on a wafer base station such that the wafer is aligned with the wafer base station. The reference marks on the wafer base station are also aligned with alignment marks on a mask plate so that alignment between the wafer and the mask plate is realized.

Chemical-mechanical polishing (C1VIP) is a commonly used process in the manufacture of semiconductor wafers. CMP involves chemically etching a surface while also mechanically grinding or polishing it. Because wafers are fabricated by forming many layers of different materials one on top of another, it is important that each layer is extremely flat and smooth, or planarized, before receiving another layer. It has been found that CMP is extremely well suited for planarizing whole, or portions of, wafers and it has become one of the most important techniques for planarizing layers in wafers.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
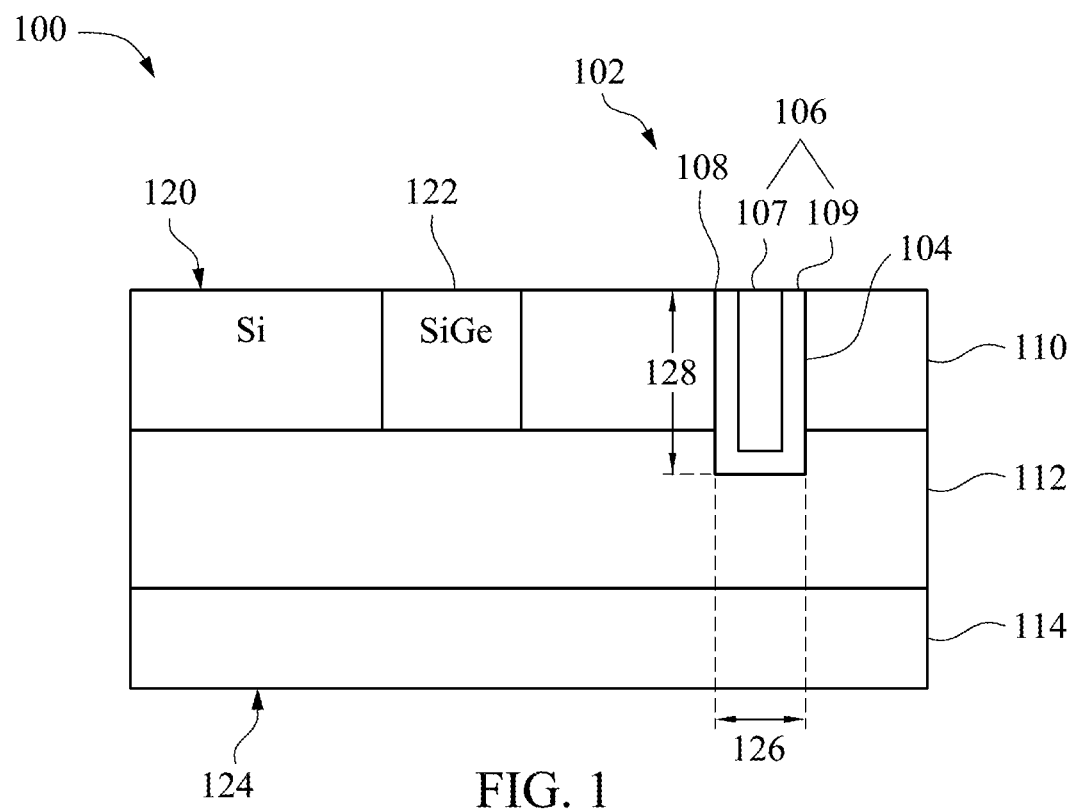
FIG. 1 is an example wafer having an alignment mark.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

While it is very useful in particular processes of planarizing wafers, CMP can complicate matters in other sets of processes, such as in preserving the integrity of alignment marks that have already been formed on layers. For example, alignment marks are formed on layers of a wafer for the purposes of aligning one layer with respect to another one or aligning a layer with a mask plate in photolithography. Given the abrasive nature of chemical mechanical polishing, a CMP procedure may damage the structure or dimension of an alignment mark. The nature of the problem cited above can be seen by noting that CMP is generally accomplished by polishing the surface of a wafer against a polishing pad wetted with a slurry comprised of three ingredients: an acidic or basic solvent, an abrasive, and a suspension fluid. The combined action of surface chemical reaction and mechanical polishing allows for a controlled, layer by layer removal of a desired material from the wafer surface, resulting in a preferential removal of protruding surface topography and a planarized wafer surface. Thus, if features such as alignment marks on the surface of a wafer are not properly designed and protected from the CMP action, they can be damaged or destroyed. The disclosure techniques herein provide solutions that, among others, overcome these problems.

FIG. 1 shows a cross-sectional view of a wafer 100 including an alignment mark 102. From a top view (not shown for simplicity), the alignment mark 102 may include a simple geometrical shape such as a rectangle, a circle, or a cross. The alignment mark 102 may include any shape in the top view and is not limited by any of the top view shapes. From the cross-sectional view of FIG. 1, the alignment mark 102 includes a recess 104 and a filling 106 in the recess 104. The recess 104, in some embodiments, is etched with a relatively shallow depth into a respective layer 110, e.g., a silicon layer, of the wafer 100. FIG. 1 shows that the recess 104 extends through the layer 110 and into another layer 112 below the layer 110 and between the layer 110 and a substrate 114, which is an illustrative example and does not limit the scope of the disclosure. For example, the recess 104 may extend through the layer 110 and layer 112 and terminate within another layer and may extend into the substrate 114. The recess 104 may also terminate within the layer 110 without extending through the layer 110.

The position of the alignment mark 102 is sensed by a laser beam (not shown) as the laser beam traverses edge 108 of alignment mark 102. Therefore, the integrity of the edge 108 and the dimension of the edge 108 must be preserved throughout the various process steps conducted on the wafer 100, or specifically on the layer 110, where the alignment mark 102 is located. In some embodiments, the filling 106 includes a material that is conformal such that the exact shape and depth of the recess 104 are replicated by the filling 106 such that the alignment mark 102 can be accurately sensed by, e.g., a laser beam. In some embodiments, the filling 106 is silicon oxide, silicon nitride, low-k dielectric materials that is similar to those commonly used, polymer material, or other suitable materials that allow laser beam or other observing or sensing beams to pass through. In some embodiments, the filling 106 may include multiple layers 107, 109 having different materials.

In some embodiments, the alignment mark 102 is located on a front side 120 of the wafer 100. Some structures 122, e.g., of a different material from that of the layer 110, may be formed in the layer 110 on the front side 120 of the wafer 100. In some embodiments, the alignment mark 102 may also be located on a back side 124 of the wafer 100.

In some embodiments, the recess 104 of the alignment mark 102 has a width 126 in a range of 1 μm and 2.5 μm and a height 128 in a range of 150 nm and 250 nm. Other dimensions are also possible and included in the scope of the disclosure.

Figure 2A:
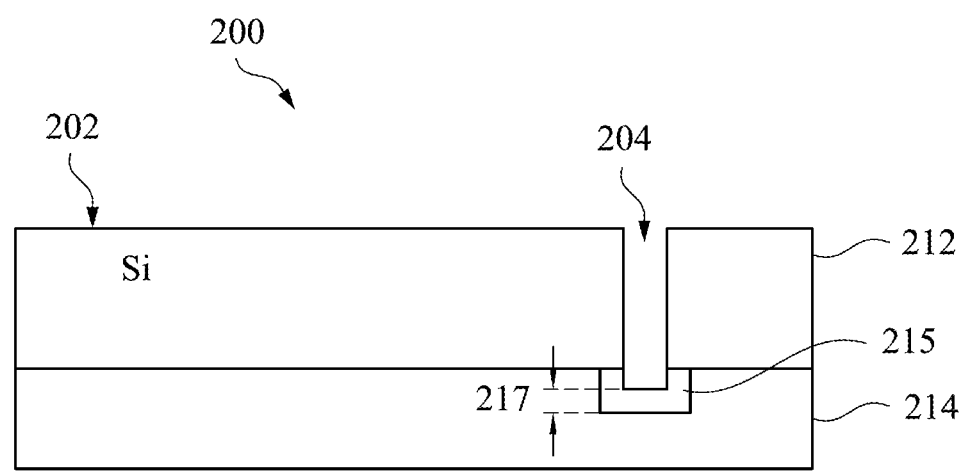
FIGS. 2A-2F illustrate a process of making an alignment mark on a wafer.

FIGS. 2A to 2F show a process of forming an alignment mark, e.g., the alignment mark of FIG. 1. Referring to FIG. 2A, a recess 204 is formed in a wafer 200. The recess 204 is forming by etching on a first surface 202, e.g., a front side surface, of the wafer 200. Specifically, in an example, the recess 204 is formed in and through a layer 212 and reaches and terminates in a layer 214 below the layer 212. The layer 212 may be any layer formed in a front-end-of-line (FEOL), back-end-of-line (BEOL), middle-end-of-line (MEOL) processes. For example, the layer 212 may be a semiconductor layer, e.g., a silicon layer or other semiconductor materials. The layer 212 may also be a dielectric layer or a metallization layer. The layer 214 may be any layer formed in a front-end-of-line (FEOL), back-end-of-line (BEOL), middle-end-of-line (MEOL) processes. For example, the layer 214 may be a semiconductor layer, e.g., a silicon layer or other semiconductor materials. The layer 214 may also be a dielectric layer or a metallization layer. In the description herein, as an illustrative example, the layer 212 is a silicon layer and the layer 214 is a dielectric layer. In some embodiments, metal features are embedded or formed in the dielectric layer 214. In some embodiments, the forming the recess 204 may include forming a photoresist layer on the front side surface 202 of the substrate 200. The photoresist layer has openings formed therein. The openings may be formed using acceptable photolithography techniques, such as using a lithography mask to expose the photoresist layer to light where the openings are to be formed. After the formation of the openings in the photoresist layer, an etch process, such as an anisotropic etch, is performed to create recess 204 recessed below the first surface 202 of the wafer 200.

In some embodiment, the recess 204 overlaps a trench feature 215 in the layer 214. The trench feature 215 may be filled with a same material as the layer 212, e.g., silicon, or may include a different material from that of the layer 212. In some embodiments, the material in the trench layer 215 is different from that of the layer 214. In some embodiments, the recess 204 extends into the trench feature 215. A thickness 217 of the trench feature 215 after the recess 204 has been formed is in a range between about 30 nm to about 90 nm. In some embodiments, the thickness 217 is in a range between about 50 nm to about 75 nm. In some embodiment, the trench feature 215 is an alignment mark in the layer 214.

Figure 2B:
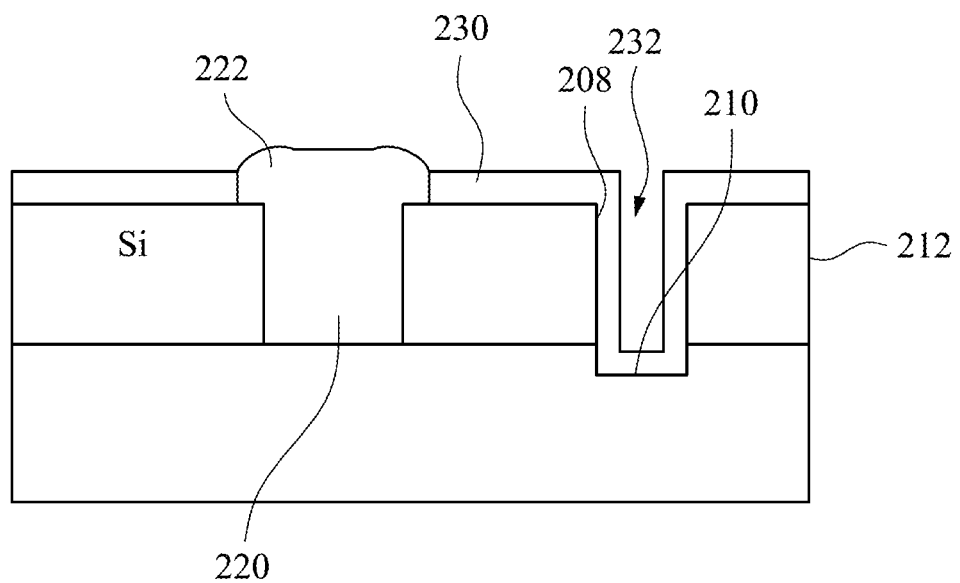

As illustrated in FIG. 2B, a device structure 220 is formed in the layer 212. In some embodiment, the device feature 220 includes a different material from that of the layer 212. For example, in some embodiments, the layer 212 is silicon and the device feature 220 is silicon germanium, silicon carbide, other silicon-containing semiconductor materials, or other suitable materials. The device structure 220 may be any device structures, e.g., a doped region, a source/drain structure, a gate structure, an interconnection structure, e.g., a through silicon via, or other suitable structures or elements of a semiconductor device or an integrated circuit formed on the wafer 200. In some embodiments, an alignment mark structure is formed in the layer 212 so that another feature or layer formed over the layer 212 may be aligned correctly based on the alignment mark. For example, an interconnection via structure may be formed in alignment with the device feature 220 based on the alignment mark. In some embodiments, the forming the device structure 220 forms an excessive portion 222 that protrudes from the first surface 202. The excessive portion 222 is to be removed through a planarization procedure, e.g., a chemical mechanical polishing (CMP) procedure. It should be appreciated that the device structure 220 may be formed before or after the forming the recess 204 of FIG. 2A.

As shown in FIG. 2B, in some optional embodiments, one or more isolation layers 230 are formed in the recess 204. The isolation layers 230 may be silicon nitride, silicon oxide, silicon carbide, silicon oxynitride, an oxide, a polymer material, a combination thereof, and/or other suitable materials. The isolation layers 230 may be deposited using acceptable deposition techniques, such as a chemical vapor deposition (CVD) process or, further, by a CVD using a low temperature. In some embodiments, the isolation layer 230 is formed on exposed first surface 202 and in the recess 204 including the edge surfaces 208 and a bottom surface 210 of the recess 204 and conforms to those surfaces. After the formation of the isolation layer, there is still a gap or opening 232 in the recess 204.

As shown in FIG. 2B, as an example, the excessive portion 222 of the device structure 220 is exposed from the isolation layer 230. The specific example does not limit the scope of the disclosure. In other embodiments, the excessive portion 222 may be covered by the isolation layer 230. In some embodiments, after the isolation layer 230 is formed over the layer 212, the isolation layer 230 is thinned by, e.g., etching. The thinning the isolation layer 230 may expose the excessive portion 222.

Figure 2C:
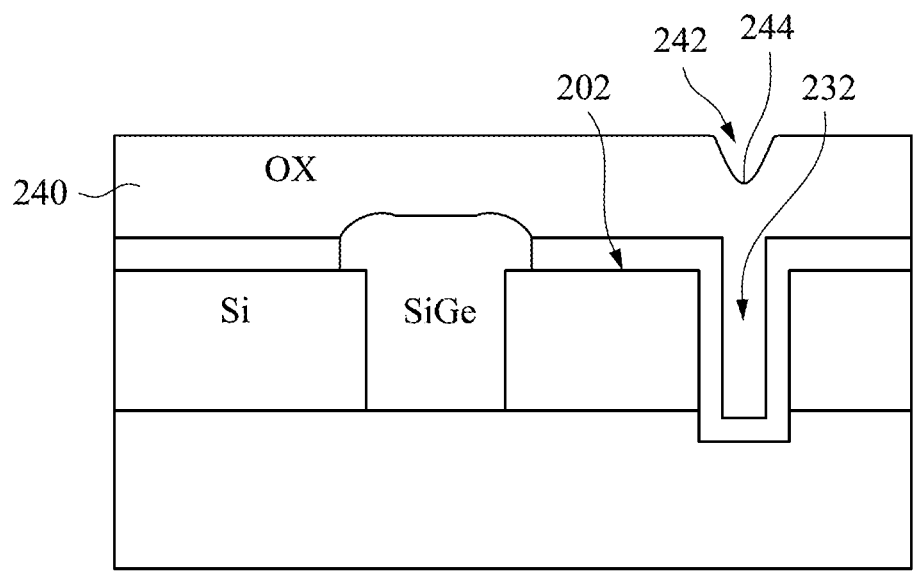

In FIG. 2C, a layer 240 is formed over the surface 202 of the wafer 200 and filling the opening 232 in the recess 204. In some embodiments, the layer 240 includes silicon oxide, plasma enhanced tetraethyl orthosilicate (P-TEOS), borophosphosilicate glass (BPSG), plasma enhanced oxide (PEOX), an oxide made by furnace chemical vapor deposition (FCVD), high density plasma oxide (HDP), phosphosilicate glass (PSG), spin-on-dielectrics (SOD), thermal oxide, silicon-containing organic polymers, silicon-containing hybrid organic/inorganic materials, organosilicate glass (OSG), tetraethyl orthosilicate (TEOS), fluorinated silicate glass (FSG), hemispherical grain (HSQ), carbon-doped oxide (CDO) glass, combinations thereof, or other suitable dielectric materials. In some embodiments, the layer 240 has a same material as an inter-layer dielectric layer formed on the wafer 200.

In some embodiments, a thickness of the layer 240 is controlled such that the opening 232 of the recess 204 is fully filled by the layer 240. Depending on the characteristics of the material of the layer 240 and/or the characteristics of the process of forming the layer 240, the layer 240 may include a recess portion 242 overlapping the opening 232 (now filled by the layer 240). A bottom level 244 of the recess portion 242 does not extend downwardly beyond the first surface 202.

In some embodiments, as shown in FIG. 2C, the layer 240 covers the excessive portion 222 of the device structure 220. This example embodiment does not limit the scope of the disclosure. In some embodiments, the excessive portion 222 may be exposed from the layer 240.

Figure 2D:
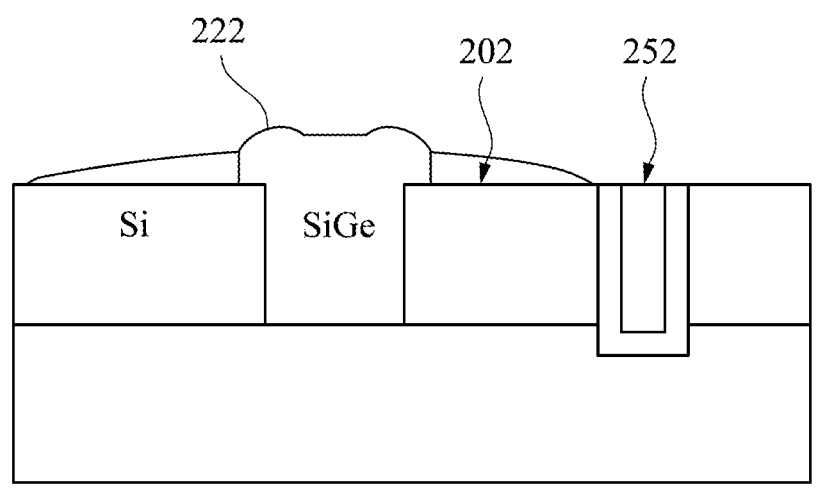

In FIG. 2D, a first planarization process, e.g., a first CMP procedure, is conducted to planarize the layer 240 to a level, e.g., to the level of the first surface 202. In some embodiments, a slurry of the first CMP procedure is highly selective between the material of the layer 240 and the material of the excessive portion 222 so that the first CMP procedure does not remove the excessive portion 222. In some embodiments, the removal rate ratio between materials of the layer 240 and the excessive portion 222 is in a range of 75:1 and 200:1. In some embodiments, in a case that the device structure 220 is SiGe and the layer 240 is silicon oxide, the slurry has a removal rate of 1020:12.9 between the layer 240 and the excessive portion 222. Further, in some embodiments, the first CMP procedure includes no or a low downforce pressure in a range of 0 psi and 2 psi. The low downforce pressure facilitates improved end point detection (EPD) for the excessive portion 222 of the device structure 220. If the downforce is too large, the first CMP may cause serious dishing on the layer 212 and the layers 230, 240 in the recess 204.

In some embodiments, the first CMP procedure also removes the isolation layer 230 to the level of the first surface 202, e.g., until the first surface 202 is exposed. After the first CMP procedure is completed, a surface 252 of the layer 240 in the recess 204 is substantially at a same level as, or coplanar with, the first surface 202. During the first CMP procedure, the layer 240 in the recess 204, or specifically in the opening 232, remains intact and is not damaged by the first CMP procedure. For example, to maintain the integrity of the layer 240 in the recess 204, e.g., to avoid the dishing effect, the first CMP includes a low rotation speed in a range of 30 and 55 rpm. In some embodiments, some residual portion of the layer 240 may remain on the first surface 202, especially adjacent to the excessive portion 222.

Figure 2E:
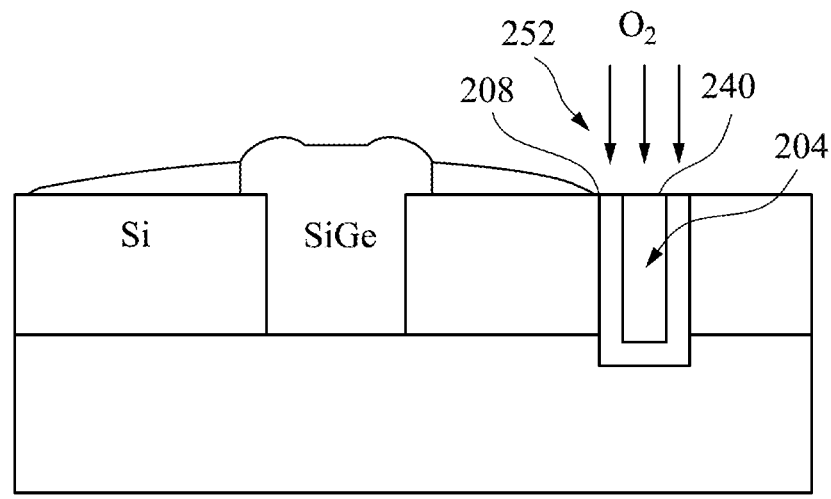

In FIG. 2E, in some embodiments, the layer 240 in the recess 204 is treated with an oxygen plasma under a temperature in a range of 350° C. and 450° C. and for a duration in a range of 20 seconds and 60 seconds. The oxygen plasma treatment reduces surface roughness and improves surface hardness of the surface 252 of the layer 240 in the recess 204. Resultantly, the surface 252 and the edges 208 of the recess 204 are less susceptible to dishing in a CMP procedure, e.g., a CMP procedure to remove the excessive portion 222 of the device structure 220.

Figure 2F:
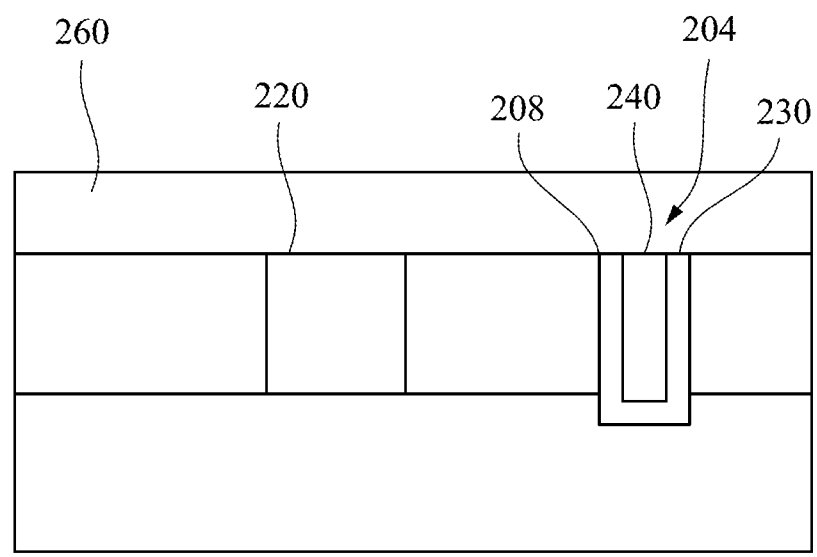

In FIG. 2F, a second CMP procedure is conducted to remove the excessive portion 222 of the device structure 220. In some embodiments, a slurry used for the second CMP procedure has a high selectivity between the material of the device structure 220 and the material of the layer 240 in the recess 204. In some embodiments, a ratio of removal rates of the slurry of the second CMP procedure on the device structure 220 and the layer 240 is in a range of 12:1 and 20:1. In some embodiments, the slurry of the second CMP procedure has a very low selectivity or no selectivity between the device structure 220 and the layer 212. In some embodiments, the layer 212 is silicon Si, the device structure 220 is silicon germanium SiGe, and the layer 240 in the recess 204 is silicon oxide, and the slurry used in the second CMP procedure has removal rates among silicon, silicon germanium and silicon oxide of about 57:61:4.2. As such, the second CMP procedure does not damage the layer 240 in the recess 204. Further the slurry of the second CMP is also selected to have a very low removal rate of the isolation layer 230 in the recess 204.

Because the recess 204 is filled with the layer 240. The edge surfaces 208 of the recess 204 are protected by the layer 240 and the layer 230 from being damaged by the second CMP procedure. As such, the dimensions of the recess 204 are not changed by the second CMP procedure or other CMP procedures for device features made on the layer 212. The recess 204 and the layer 240 and the layer 230 in the recess 204 may be used as an alignment mark 102 of FIG. 1. The alignment between the layer 212 and the subsequent layers formed on the wafer 200 or mask layers used to form the subsequent layers on the wafer 200 are improved because the dimensions of the alignment mark 102 on the layer 212 is maintain intact.

After the alignment mark 102 is formed, another layer 260, e.g., a dielectric layer, is formed directly on the layer 212, the device feature 220 and the alignment mark 102. Because the layer 240 in the recess 204 is treated with oxygen plasma, even if the layer 260 is a same dielectric material as the layer 240 in the recess 204, the material composition and property of the layer 240 is different from that of the layer 260. For example, in a case that layer 240 and layer 260 are both silicon oxide, the silicon oxide of layer 240 contains less surface organic groups, e.g., residual hydroxyl group, than the silicon oxide of the layer 260 because the residual hydroxyl group in the layer 240 has been substantively removed by the oxygen plasma treatment.

Figure 3:
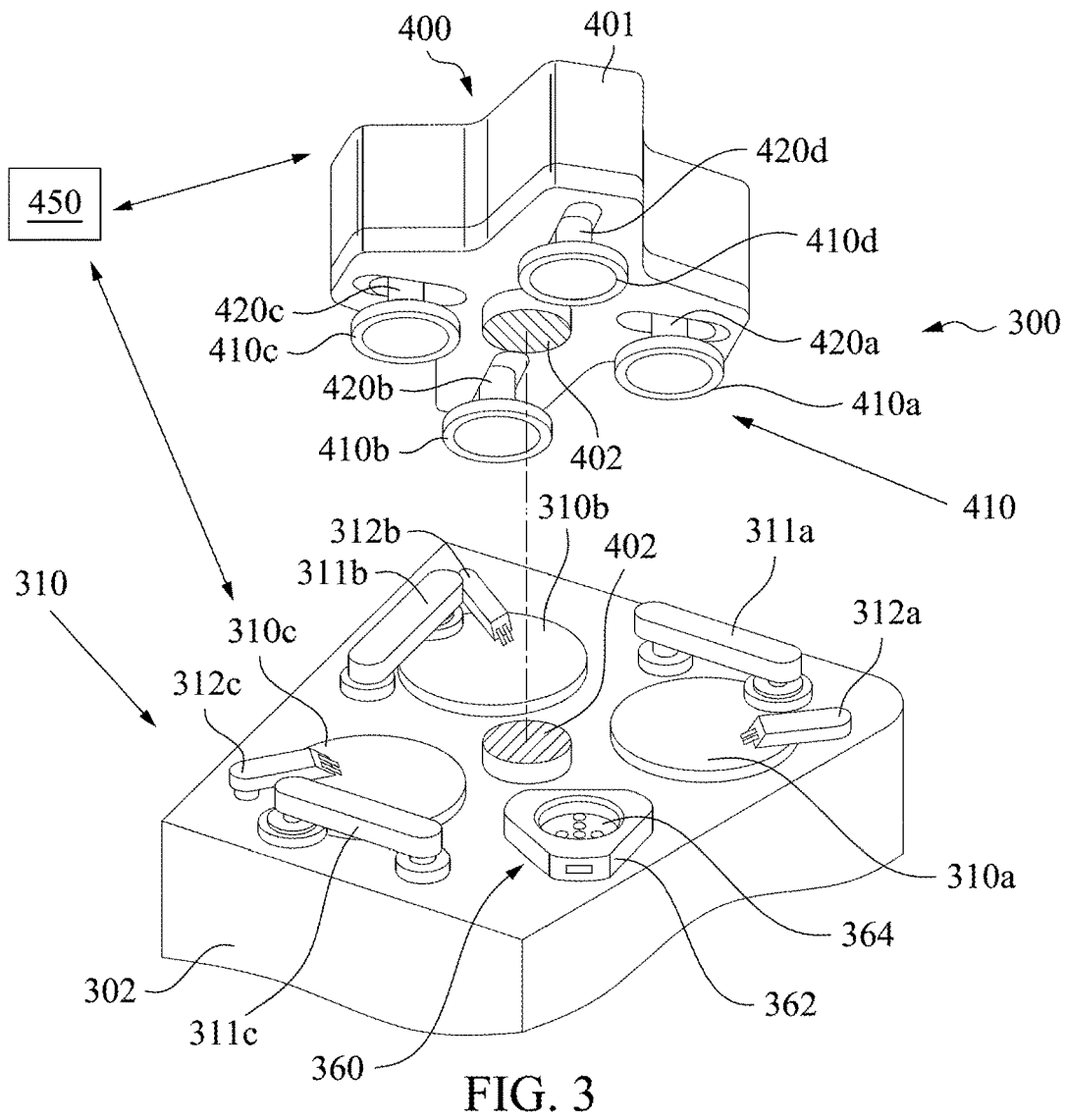
FIG. 3 illustrates an example CMP device.

FIG. 3 shows an example CMP apparatus 300. The CMP apparatus 300 includes a base 302; a plurality of polishing pads 310 (polishing pads 310a, 310b, and 310c shown) coupled to respective rotating platens (not specifically shown in FIG. 3) provided on the base 302; a head clean load/unload (HCLU) station 360 that includes a load cup 362 for the loading and unloading of wafers (not shown) onto and from, respectively, the polishing pads 310; and a head rotation unit 400 having multiple polishing heads 410 (410a, 410b, 410c and 410d shown) for holding and fixedly rotating the wafers on the polishing pads 310.

A controller 450 is communicatively coupled to the base 302 and the head rotation unit 400 and controls the operations of each of the polishing pads 310 and the polishing heads 410.

The three polishing pads 310a, 310b and 310c facilitate simultaneous processing of multiple wafers in a short time. Each of the polishing pads 310 is mounted on a rotatable platen. Pad conditioners 311a, 311b and 311c are provided on the base 302 and can be swept over the respective polishing pads 310 for conditioning the polishing pads. Slurry supply arms 312a, 312b and 312c are further provided on the base 302 for supplying CMP slurry to the surfaces of the respective polishing pads 310.

The polishing heads 410a, 410b, 410c and 410d of the head rotation unit 400 are mounted on respective rotation shafts 420a, 420b, 420c, and 420d which are rotated by a driving mechanism (not shown) inside the frame 401 of the head rotation unit 400. The polishing heads 410 hold respective wafers (not shown) and press the wafers against the top surfaces of the respective polishing pads 310 (310a, 310b and 310c shown). In this manner, material layers are removed from the respective wafers. The head rotation unit 400 is supported on the base 302 by a rotary bearing 402 during the CMP process.

In some embodiment, a polishing pad 310 is constructed in two or more layers, with a resilient layer as an outer layer of the pad. The layers are typically made of a polymeric material such as polyurethane and may include a filler for controlling the dimensional stability of the layers. A polishing pad 310 is made several times the diameter of a wafer in a rotary CMP, while the wafer is kept off-center on the polishing pad in order to prevent polishing of a non-planar surface onto the wafer. The wafer itself is also rotated during the polishing process, e.g., by the polishing heads 410, to prevent polishing of a tapered profile onto the wafer surface. The axis of rotation of the wafer and the axis of rotation of the pad are deliberately not collinear; however, the two axes may be parallel.

In the operation of the CMP apparatus 300, each wafer is mounted on a polishing head 410a, 410b, 410c or 410d and is sequentially polished against the polishing pads 310a, 310b and 310c, respectively.

Figure 4:
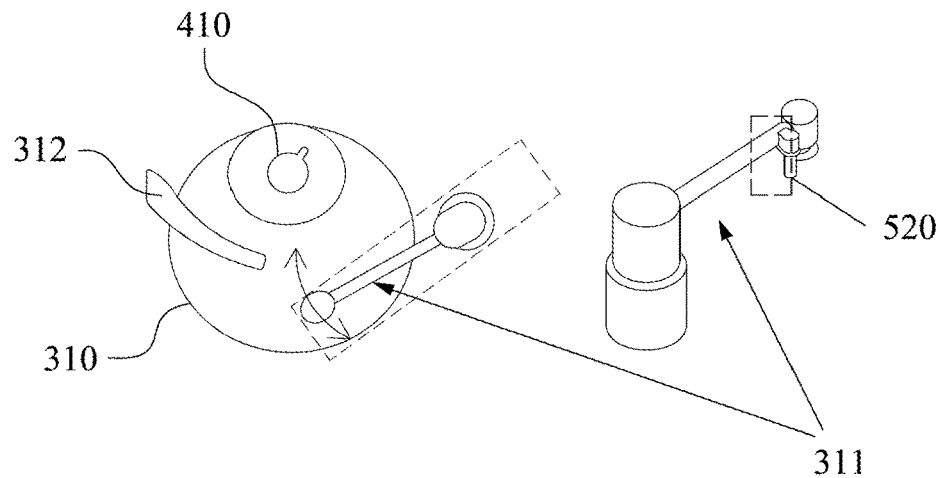
FIG. 4 shows, in a top view, a pad conditioner coupled to a CMP pad.
Figure 5:
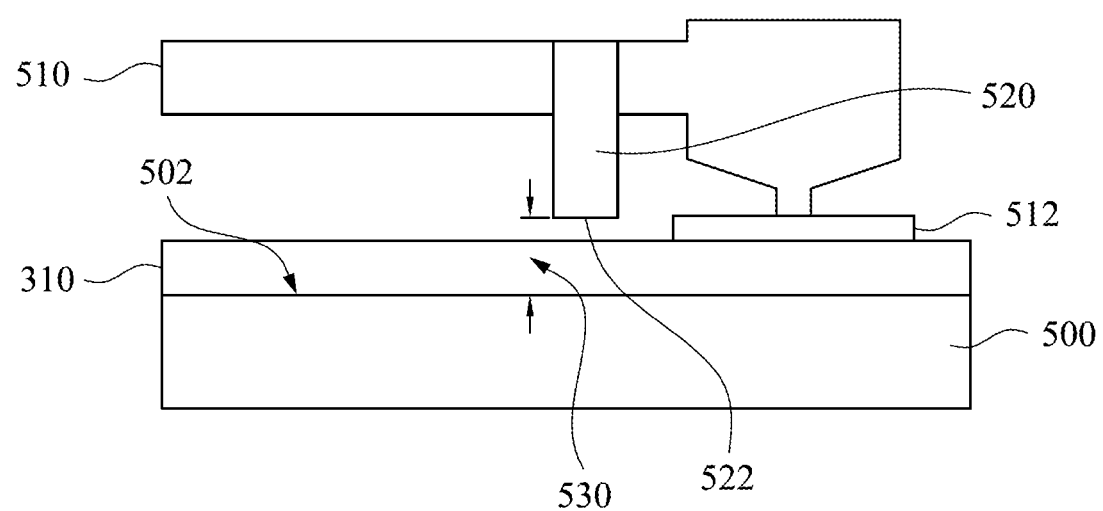
FIG. 5 shows, in a side view, a pad conditioner coupled to a CMP pad.

FIG. 4 shows a top view of a pad conditioner 311 coupled to a CMP pad 310. FIG. 5 shows a side view of the pad conditioner 311 coupled to a CMP pad 310 on a rotating platen 500. Referring to FIGS. 4 and 5 together, the conditioner 311 includes an arm 510 and a conditioning disk 512 coupled to the arm 510. A pad thickness sensor 520 is coupled to or integrated on the arm 510. When the conditioner 311 is swept over the polishing pad 310 for conditioning the polishing pad 310, the pad thickness sensor 520 detects a thickness of the pad 310, or in some embodiments, the thickness of the resilient outer layer of the pad 310. As the pad 310 rotates with the platen 500, the pad thickness sensor 520 can detect thickness information on different surface areas of the pad 310. As such, the pad thickness sensor 520 is capable to detect a thickness profile of the pad 310.

The pad thickness sensor 520 can be a range sensor, a laser sensor or other suitable type of sensors that can detect signals indicating the thickness value of the pad 310. In some embodiment, the pad thickness sensor 520 detects a distance 530 between a tip end 522 of the pad thickness sensor 520 and a surface 502 of the platen 500. At a pad surface area of smaller pad thickness, the conditioning disk 512 is lowered to interface with the surface of the pad 310. Resultantly, the distance 530 becomes smaller. At a surface area of greater pad thickness, the conditioning disk 512 is elevated to interface with the surface of the pad 310. Resultantly, the distance 530 becomes greater. Thus, the detected distance 530 serves as a pad thickness signal indicating thickness of pad 310 in various surface areas.

The pad thickness data or thickness profile of the pad 310 may be communicated to controller 450. The controller 450 may control the operations of the base 302 or the head rotation unit 400 based on the pad thickness profile of the pad 310. For example, the controller 450 may control a wafer to stay longer with a pad 310 having a greater pad thickness than with a pad 310 having a smaller pad thickness. The controller 450 may control a wafer to stay longer at a pad surface area having a greater pad thickness than at a pad surface area having a smaller pad thickness. Other approaches of controlling the CMP operations based on the pad thickness information or profile of the polishing pad 310 are also possible and included in the disclosure.

The disclosed techniques are further understood with the following embodiments.

In a first embodiment, a method comprises: forming a recess in a first region of a first surface of a wafer, the first region designated for an alignment mark; forming a device structure in a second region of the first surface of the wafer; depositing a first layer on the first surface of the wafer, the first layer completely filling the recess; conducting a first planarization procedure to remove the first layer to a first level; and after the first planarization procedure, conducting a second planarization procedure to remove the device structure to a second level.

In a second embodiment, a structure comprises: a substrate having a first surface; a first device structure on a first region of the first surface; and an alignment mark on a second region of the first surface, the alignment mark including a recess and a filling material in the recess.

In a third embodiment, a wafer comprises: a substrate having a first surface; and an alignment mark on the first surface, the alignment mark including a recess and a layer that completely fills the recess, a second surface of the layer being substantially at a same level as the first surface.

The various embodiments described above can be combined to provide further embodiments.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a recess in a first region of a first surface of a wafer, the first region designated for an alignment mark, the recess extending in and downwardly beyond a first layer on a substrate of the wafer;
   forming a device structure in a second region of the first surface of the wafer, the device structure extending in the first layer;
   depositing a second layer on the first surface of the wafer, the second layer filling in the recess and at least laterally adjacent to the device structure;
   conducting a first planarization procedure to remove a first portion of the second layer adjacent to the recess to a first level, with the device structure remaining in the first layer;
   after the first planarization procedure, treating the second layer with oxygen plasma; and
   after the treating the second layer with oxygen plasma, conducting a second planarization procedure to remove the device structure to a second level on the first layer.

2. The method of claim 1, wherein the second level is a same level as the first level.

3. The method of claim 1, wherein the treating the second layer with oxygen plasma improves surface hardness of a surface of the second layer in the recess.

4. The method of claim 1, comprising, after the first planarization procedure, treating a surface of the second layer adjacent to the recess using oxygen plasma.

5. The method of claim 1, wherein the second layer is silicon oxide.

6. The method of claim 1, wherein the second layer is silicon nitride.

7. The method of claim 1, wherein the second layer is a polymer material.

8. The method of claim 1, wherein the second layer allows a laser light to pass through.

9. The method of claim 1, comprising forming an isolation layer in the recess, wherein the second layer is formed on the isolation layer.

10. The method of claim 9, wherein the isolation layer is a dielectric material that is different from the second layer.

11. A method, comprising:
    forming a recess in a first region of a first surface of a wafer, the first region designated for an alignment mark, the recess extending in and downwardly beyond a first layer on a substrate of the wafer, a device structure being at least partially located in the first layer;
    depositing a second layer filling in the recess, with the device structure remaining at least partially located in the first layer;
    forming the alignment mark by treating the second layer with oxygen plasma; and
    after the treating the second layer with oxygen plasma, conducting a planarization procedure to remove a portion of the device structure to a level on the first layer, with the device structure remaining at least partially located in the first layer.

12. The method of claim 11, wherein the second layer is one or more of silicon oxide, silicon nitride, or a polymer material.

13. The method of claim 11, wherein the second layer allows a laser light to pass through.

* * * * *